United States Patent
Tsai et al.

(10) Patent No.: US 11,855,224 B2
(45) Date of Patent: Dec. 26, 2023

(54) LEAKAGE PREVENTION STRUCTURE AND METHOD

(71) Applicant: Taiwan Semiconductor Manufacturing Co., Ltd., Hsinchu (TW)

(72) Inventors: Ching-Wei Tsai, Hsinchu (TW); Yi-Bo Liao, Hsinchu (TW); Sai-Hooi Yeong, Hsinchu County (TW); Hou-Yu Chen, Hsinchu County (TW); Yu-Xuan Huang, Hsinchu (TW); Kuan-Lun Cheng, Hsin-Chu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/682,806

(22) Filed: Feb. 28, 2022

(65) Prior Publication Data
US 2022/0181496 A1 Jun. 9, 2022

Related U.S. Application Data

(63) Continuation of application No. 16/947,372, filed on Jul. 30, 2020, now Pat. No. 11,264,508.

(60) Provisional application No. 62/965,613, filed on Jan. 24, 2020.

(51) Int. Cl.
*H01L 29/786* (2006.01)
*H01L 21/02* (2006.01)
(Continued)

(52) U.S. Cl.
CPC .. *H01L 29/78612* (2013.01); *H01L 21/02532* (2013.01); *H01L 21/02603* (2013.01); *H01L 21/324* (2013.01); *H01L 29/0673* (2013.01);
*H01L 29/1083* (2013.01); *H01L 29/42392* (2013.01); *H01L 29/66537* (2013.01); *H01L 29/66545* (2013.01); *H01L 29/66553* (2013.01);
(Continued)

(58) Field of Classification Search
CPC .......... H01L 29/78612; H01L 29/0673; H01L 29/1083; H01L 29/42392; H01L 29/66537; H01L 29/66545; H01L 29/66553; H01L 29/66636; H01L 29/66742; H01L 29/78618; H01L 29/78696; H01L 21/02532; H01L 21/02603; H01L 21/324
USPC ....................................................... 257/347
See application file for complete search history.

(56) References Cited

U.S. PATENT DOCUMENTS 9,818,872 B2  11/2017  Ching
9,887,269 B2   2/2018  Ching et al.
(Continued)

FOREIGN PATENT DOCUMENTS

KR     20150016166 A    2/2015

*Primary Examiner* — Tong-Ho Kim

(57) ABSTRACT

A semiconductor device according to the present disclosure includes an anti-punch-through (APT) region over a substrate, a plurality of channel members over the APT region, a gate structure wrapping around each of the plurality of channel members, a source/drain feature adjacent to the gate structure, and a diffusion retardation layer. The source/drain feature is spaced apart from the APT region by the diffusion retardation layer. The source/drain feature is spaced apart from each of the plurality of channel members by the diffusion retardation layer. The diffusion retardation layer is a semiconductor material.

20 Claims, 20 Drawing Sheets

(51) Int. Cl.
  *H01L 21/324* (2006.01)
  *H01L 29/06* (2006.01)
  *H01L 29/10* (2006.01)
  *H01L 29/66* (2006.01)
  *H01L 29/423* (2006.01)

(52) U.S. Cl.
  CPC .. *H01L 29/66636* (2013.01); *H01L 29/66742* (2013.01); *H01L 29/78618* (2013.01); *H01L 29/78696* (2013.01)

(56) References Cited

U.S. PATENT DOCUMENTS

| | | |
|---|---|---|
| 9,899,398 B1 | 2/2018 | Colinge et al. |
| 10,109,721 B2 | 10/2018 | Lin et al. |
| 10,157,799 B2 | 12/2018 | Ching et al. |
| 10,199,502 B2 | 2/2019 | Huang et al. |
| 10,290,546 B2 | 5/2019 | Chiang et al. |
| 10,453,824 B1 | 10/2019 | Mochizuki et al. |
| 10,475,902 B2 | 11/2019 | Lee |
| 11,264,508 B2 * | 3/2022 | Tsai ................. H01L 21/02603 |
| 2012/0142159 A1 | 6/2012 | Kim |
| 2015/0035071 A1 | 2/2015 | Ching et al. |
| 2016/0104765 A1 | 4/2016 | Ching et al. |
| 2017/0301786 A1 | 10/2017 | Veeraragavan et al. |
| 2017/0317109 A1 | 11/2017 | Wang et al. |
| 2018/0175036 A1 | 6/2018 | Ching et al. |
| 2019/0355816 A1 | 11/2019 | Kuo et al. |
| 2020/0020774 A1 | 1/2020 | Lee |
| 2020/0168716 A1 * | 5/2020 | Peng ................. H01L 29/66545 |
| 2020/0176566 A1 | 6/2020 | Peng |
| 2020/0220018 A1 * | 7/2020 | Jang .................... H01L 29/775 |
| 2021/0098605 A1 | 4/2021 | Wang |

\* cited by examiner

LEAKAGE PREVENTION STRUCTURE AND METHOD

PRIORITY DATA

This application is a continuation application of U.S. patent application Ser. No. 16/947,372, filed Jul. 30, 2020, which claims priority to U.S. Provisional Patent Application No. 62/965,613 filed on Jan. 24, 2020, each of which is hereby incorporated herein by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, multi-gate devices have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and multi-bridge-channel (MBC) transistors (both also referred to as non-planar transistors) are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. The channel region of an MBC transistor may be formed from nanowires, nanosheets, other nanostructures, and/or other suitable structures. The shapes of the channel region have also given an MBC transistor alternative names such as a nanosheet transistor or a nanowire transistor. Epitaxial features in source/drain regions of multi-gate devices may include high concentration of dopants, such as phosphorus for n-type devices. It has been observed that dopants in the epitaxial features may diffuse into the channel regions or bases of channel regions to create leakage paths. Leakage through such leakage paths may reduce device performance or even cause device failure. Therefore, while conventional multi-gate structures may be generally adequate for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
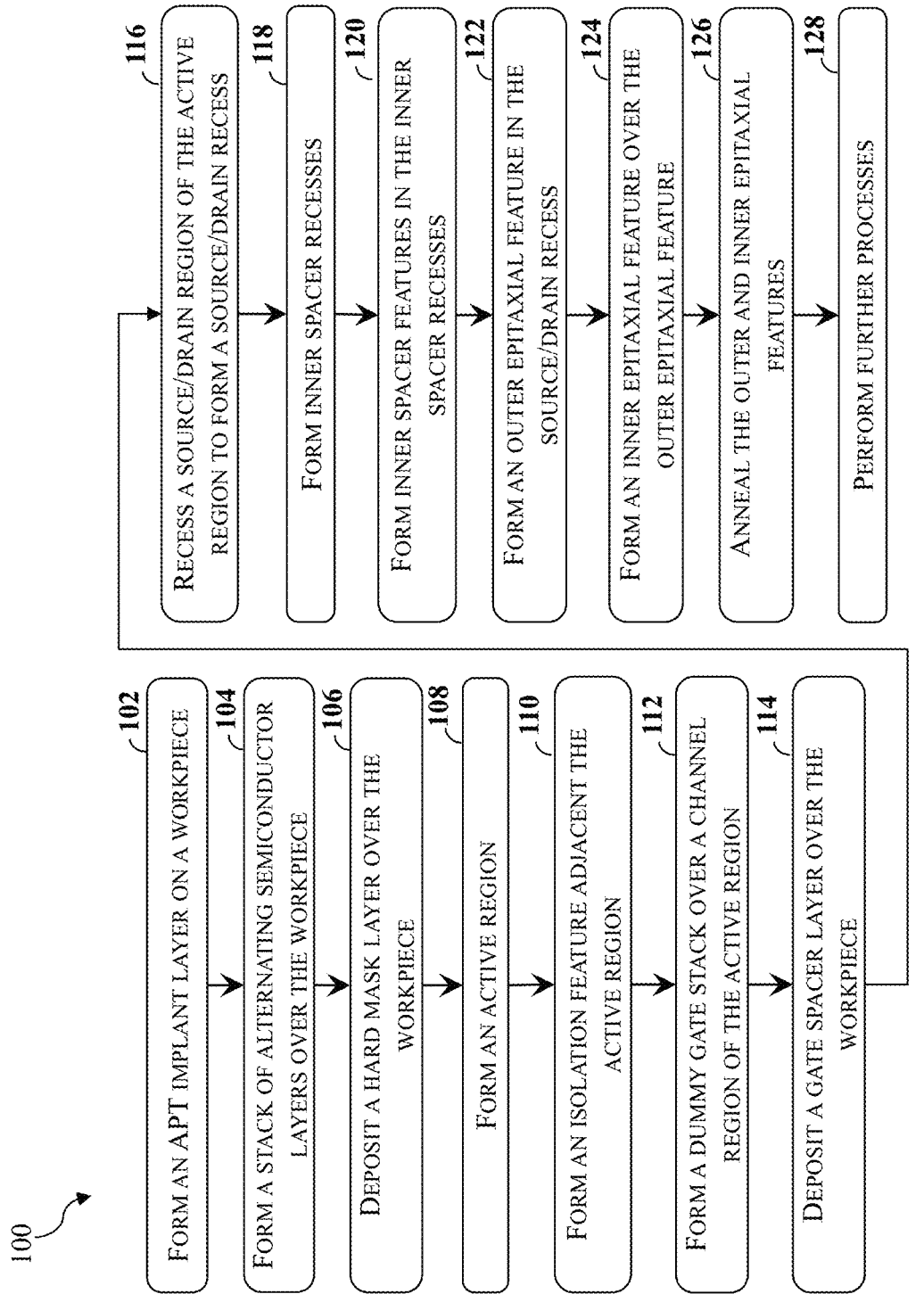
FIG. 1 illustrates a flow chart of a method for forming a semiconductor device having a diffusion retardation layer, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

The present disclosure is generally related to multi-gate transistors and fabrication methods, and more particularly to multi-gate transistors having a diffusion retardation layer to prevent leakage.

Multi-gate devices include transistors whose gate structures are formed on at least two-sides of a channel region. Examples of multi-gate devices include fin-like field effect transistors (FinFETs) having fin-like structures and MBC transistors having a plurality of a channel members. As described above, MBC transistors may also be referred to as SGTs, GAA transistors, nanosheet transistors, or nanowire transistors. These multi-gate devices may be either n-type or p-type. An MBC transistor includes any device that has its gate structure, or portion thereof, formed on 4-sides of a channel region (e.g., surrounding a portion of a channel region). MBC devices according to the present disclosure may have channel regions disposed in nanowire channel members, bar-shaped channel members, nanosheet channel members, nanostructure channel members, column-shaped channel members, post-shaped channel members, and/or other suitable channel configurations. Formation of multi-gate devices includes formation of a fin-shaped active region, deposition of a dummy gate stack over a channel region of the fin-shaped active region, deposition of a gate spacer layer over the dummy gate stack, and recessing the fin-shaped active region to form source/drain recesses adjacent the dummy gate stack. To ensure that sidewalls of the source/drain recesses are relatively straight and that the bottom-most sacrificial layer is exposed, over-etch is implemented to extend the source/drain recesses further into the substrate. In subsequent processes, doped source/drain features are then deposited into the source/drain recesses. It has been observed that dopants in the doped source/drain features may diffuse into the channel region as well as the anti-punch-through (APT) region below the fin-shaped active region, resulting in leakage paths in the channel region and/or the APT region. The leakage paths may lead to lowered yield.

The present disclosure provides embodiments of a semiconductor device where its source/drain feature includes an outer epitaxial layer to interface a channel member and an APT implant region and an inner epitaxial feature spaced apart from the channel member and the APT implant region. The outer epitaxial layer serves as diffusion retardation layer to reduce or block diffusion of dopants from the inner epitaxial feature into the channel member and the APT implant region. The inner epitaxial feature and the outer epitaxial layer may be formed of different semiconductor layers or of a semiconductor material doped with different dopants. In one embodiment, the outer epitaxial layer is formed of silicon doped with arsenide (As) while the inner epitaxial feature is formed of silicon doped with phosphorus (P). In this embodiment, the concentration of arsenide (As) in the outer epitaxial layer may reduce or block diffusion of phosphorus (P) from the inner epitaxial feature into the channel member or the APT region.

The various aspects of the present disclosure will now be described in more detail with reference to the figures. In that regard, FIG. 1 is a flowchart illustrating a method 100 of forming a semiconductor device from a workpiece according to embodiments of the present disclosure. Method 100 is merely an example and is not intended to limit the present disclosure to what is explicitly illustrated in method 100. Additional steps can be provided before, during and after the method 100, and some steps described can be replaced, eliminated, or moved around for additional embodiments of the method. Not all steps are described herein in detail for reasons of simplicity. Method 100 is described below in conjunction with FIG. 2-19, which are fragmentary cross-sectional views of the semiconductor device at different stages of fabrication according to embodiments of the method 100 in FIG. 1. For better illustration of various aspects of the present disclosure, FIGS. 9-18 each include a figure ending with A and another figure ending with B. A figure ending with A, such as FIGS. 9A-18A, illustrates a fragmentary perspective view of the workpiece 200 (or the semiconductor device 200). A figure ending with B, such as FIGS. 9B-18B, illustrates a fragmentary cross-sectional view of the workpiece 200 along the Y direction. Figures sharing the same number but ending with different letters may be collectively referred to by the number. For example, FIGS. 9A and 9B may be collectively referred to as FIG. 9.

Figure 2:
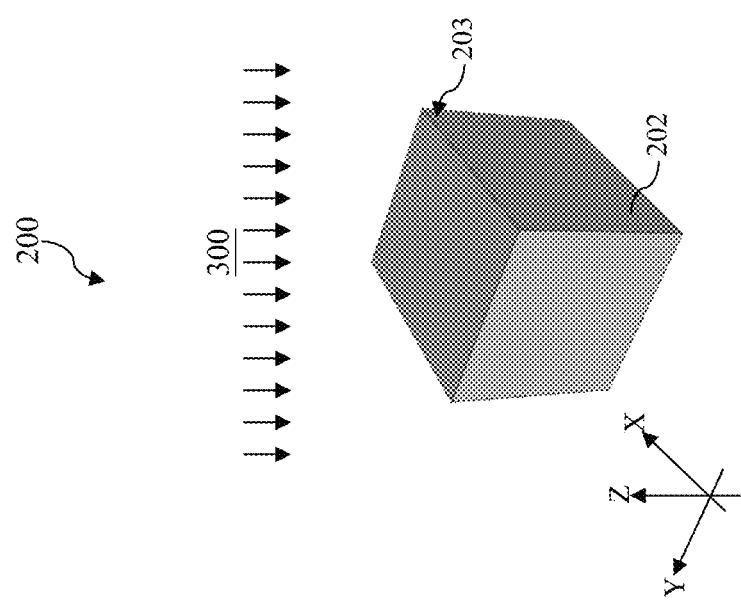
FIGS. 2-19 illustrate fragmentary cross-sectional views of a workpiece during a fabrication process according to the method of FIG. 1, according to one or more aspects of the present disclosure.

Referring to FIGS. 1 and 2, method 100 includes a block 102 where an APT implant layer 203 is formed on a workpiece 200. Because the workpiece 200 will be fabricated into a semiconductor device, the workpiece 200 may be referred to herein as a semiconductor device 200 as the context requires. The workpiece 200 includes a substrate 202. In some embodiments, the substrate 202 may be a semiconductor substrate such as a silicon substrate. The substrate 202 may include various layers, including conductive or insulating layers formed on a semiconductor substrate. The substrate 202 may include various doping configurations depending on design requirements as is known in the art. For example, different doping profiles (e.g., n-wells, p-wells) may be formed on the substrate 202 in regions designed for different device types (e.g., n-type devices and p-type devices). The suitable doping may include ion implantation of dopants and/or diffusion processes. The substrate 202 may have isolation features interposing the regions providing different device types. The substrate 202 may also include other semiconductors such as germanium, silicon carbide (SiC), silicon germanium (SiGe), or diamond. Alternatively, the substrate 202 may include a compound semiconductor and/or an alloy semiconductor. Further, the substrate 202 may optionally include an epitaxial layer (epi-layer), may be strained for performance enhancement, may include a silicon-on-insulator (SOI) structure, and/or may have other suitable enhancement features. In an embodiment of the method 100, an anti-punch through (APT) implant process 300 is performed to the substrate 202 for forming an APT implant layer 203 to prevent punch-through leakage or breakdown. The APT implant process 300 may implant the substrate 202 with dopants of a first conductivity type (or first type) when a device of a different second conductivity type (or second type) is to be formed over the APT implant layer 203. For example, a n-type device may be formed over a p-type APT implant layer and an n-type device may be formed over the p-type APT implant layer. In one embodiment, the APT implant layer 203 is doped with a p-type dopant, such as boron (B) and or $BF_2$ and an n-type multi-gate device is to be formed over the APT implant layer 203. In this embodiment, the n-type APT implant layer 203 may include silicon with a boron (B) doping concentration between about $1\times10^{18}$ atoms/cm$^3$ and about $1\times10^{19}$ atoms/cm$^3$.

Figure 3:
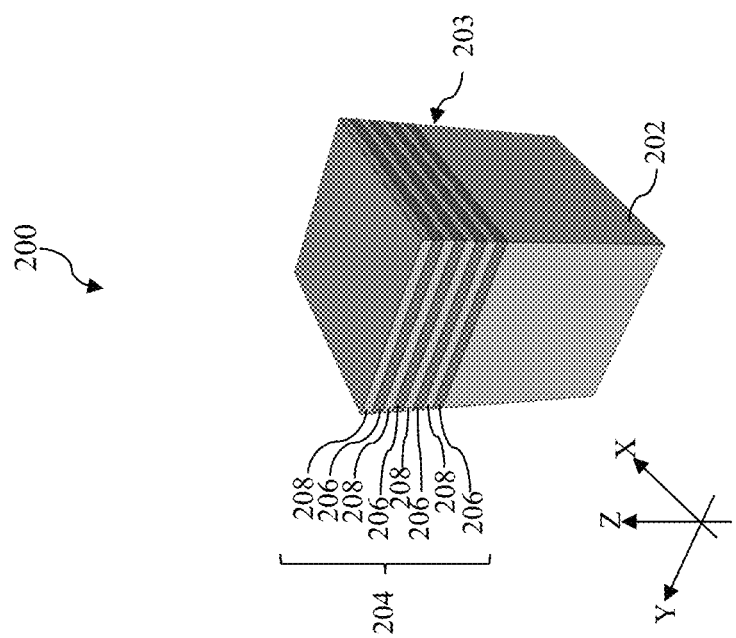

Referring to FIGS. 1 and 3, method 100 includes a block 104 where a stack 204 of alternating semiconductor layers is formed over the workpiece 200. In some embodiments, the stack 204 includes epitaxial layers 206 of a first semiconductor composition interposed by epitaxial layers 208 of a second semiconductor composition. The first and second semiconductor composition may be different. In an embodiment, the epitaxial layers 206 include silicon germanium (SiGe) and the epitaxial layers 208 include silicon (Si). However, other embodiments are possible including those that provide for a first composition and a second composition having different oxidation rates and/or etch selectivity. It is noted that four (4) layers of the epitaxial layers 206 and four (4) layers of the epitaxial layers 208 are alternately arranged as illustrated in FIG. 3, which is for illustrative purposes only and not intended to be limiting beyond what is specifically recited in the claims. It can be appreciated that any number of epitaxial layers can be formed in the stack 204. The number of layers depends on the desired number of channels members for the semiconductor device 200. In some embodiments, the number of channel layers 208 is between 2 and 10.

In some embodiments, all epitaxial layers 206 may have a substantially uniform first thickness and all of the epitaxial layers 208 may have a substantially uniform second thickness. The first thickness and the second thickness may be identical or different. As described in more detail below, the epitaxial layers 208 or parts thereof may serve as channel member(s) for a subsequently-formed multi-gate device and the thickness of each of the epitaxial layers 208 is chosen based on device performance considerations. The epitaxial layers 206 in channel regions(s) may eventually be removed and serve to define a vertical distance between adjacent channel region(s) for a subsequently-formed multi-gate device and the thickness of each of the epitaxial layers 206 is chosen based on device performance considerations. Accordingly, the epitaxial layers 206 may also be referred to as sacrificial layers 206, and epitaxial layers 208 may also be referred to as channel layers 208.

By way of example, epitaxial growth of the layers in the stack 204 may be performed by a molecular beam epitaxy (MBE) process, a metalorganic chemical vapor deposition (MOCVD) process, and/or other suitable epitaxial growth processes. In some embodiments, the epitaxially grown layers such as, the epitaxial layers 208 include the same material as the substrate 202. In some embodiments, the epitaxially grown layers 206 and 208 include a different material than the substrate 202. As stated above, in at least some examples, the epitaxial layers 206 include an epitaxially grown silicon germanium (SiGe) layer and the epitaxial layers 208 include an epitaxially grown silicon (Si) layer. Alternatively, in some embodiments, either of the epitaxial layers 206 and 208 may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. As discussed, the materials of the epitaxial layers 206 and 208 may be chosen based on providing differing oxidation, etching selectivity properties. In some embodiments, the epitaxial layers 206 and 208 are substantially dopant-free (i.e., having an extrinsic dopant concentration from about 0 $cm^{-3}$ to about $1 \times 10^{17}$ $cm^{-3}$), where for example, no intentional doping is performed during the epitaxial growth process.

Figure 4:
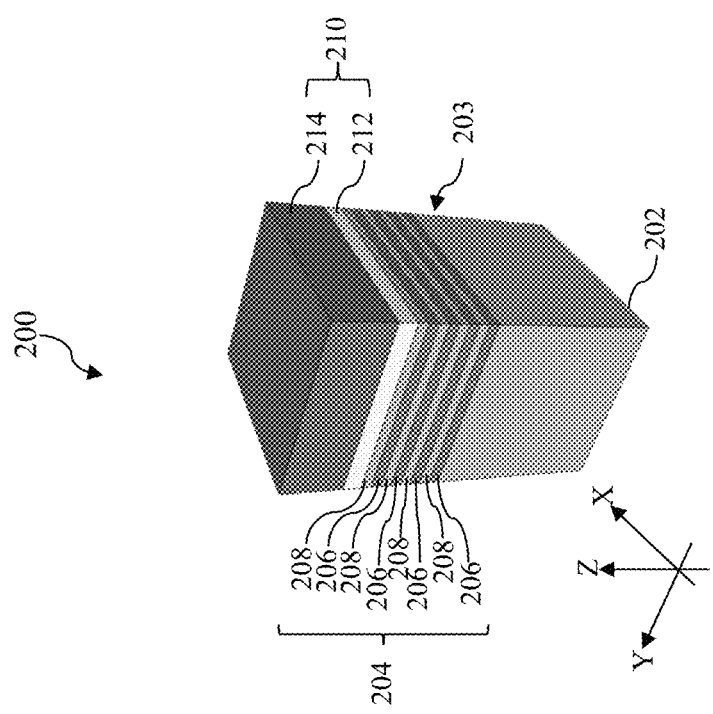

Referring to FIGS. 1 and 4, method 100 includes a block 106 where a hard mask layer 210 is formed over the workpiece 200. The hard mask layer 210 may be a single layer or a multi-layer. In embodiments represented in FIG. 4, the hard mask layer 210 includes a first hard mask layer 212 and a second hard mask layer 214 over the first hard mask layer 212. In some implementations, the first hard mask layer 212 may be formed of silicon oxide and the second hard mask layer 214 may be formed of silicon nitride. The hard mask layer 210 may be formed using chemical vapor deposition (CVD), low-pressure CVD (LPCVD), plasma-enhanced CVD (PECVD), physical vapor deposition (PVD), atomic layer deposition (ALD), thermal oxidation, electron-beam (e-beam) evaporation, or other suitable deposition techniques, or combinations thereof.

Figure 5:
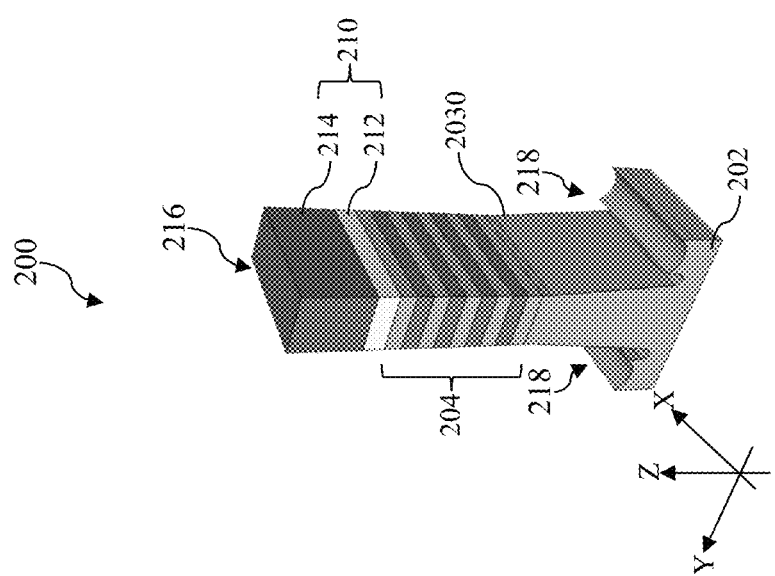

Referring to FIGS. 1 and 5, method 100 includes a block 108 where an active region 216 is formed. At block 108, the stack 204 and the APT implant layer 203 are patterned using a lithography process and an etch process. The lithography process may include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etch process may include dry etching (e.g., RIE etching), wet etching, and/or other etching methods. As shown in FIG. 5, the etch process at block 108 forms trenches 218 extending into the APT implant layer 203. The trenches 218 define the active region 216 and an APT implant region 2030 that is disposed under the active region 216. In some implementations, double-patterning or multi-patterning processes may be used to define active regions that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the active regions by etching the stack 204.

Figure 6:
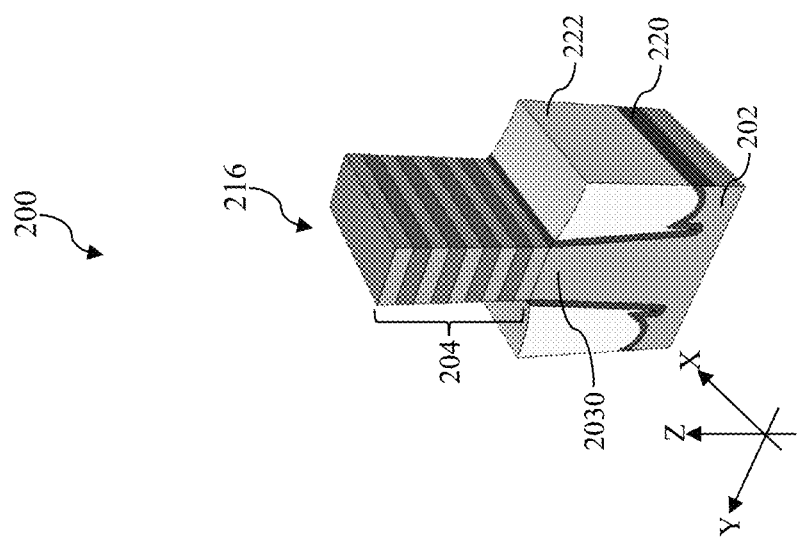

Referring to FIGS. 1 and 6, method 100 includes a block 110 where an isolation feature 222 is formed adjacent the active region 216. In some embodiments, the isolation feature 222 may be formed in the trenches 218 to isolate the active region 216 from a neighboring active region. The isolation feature 222 may also be referred to as a shallow trench isolation (STI) feature 222. By way of example, in some embodiments, a dielectric layer is first deposited over the substrate 202, filling the trenches 218 with the dielectric material. In some embodiments, the dielectric layer may include silicon oxide, silicon nitride, silicon oxynitride, fluorine-doped silicate glass (FSG), a low-k dielectric, combinations thereof, and/or other suitable materials. In various examples, the dielectric layer may be deposited by a CVD process, a subatmospheric CVD (SACVD) process, a flowable CVD process, an ALD process, a physical vapor deposition (PVD) process, and/or other suitable process. The deposited dielectric material is then thinned and planarized, for example by a chemical mechanical polishing (CMP) process. The planarized dielectric layer is further recessed or pulled-back by a dry etching process, a wet etching process, and/or a combination thereof to form the STI features 222. The active region 216 rise above the STI features 222 after the recessing. In some embodiments, the dielectric layer (and the subsequently formed STI features 222) may include a multi-layer structure, for example, having one or more liner layers. In some embodiments represented in FIG. 6, a liner 220 is formed over the workpiece 200 before the deposition of the dielectric layer, the planarization and the recess. The liner 220 may be formed of a dielectric material that is denser than the isolation feature 222. For example, the liner 220 may include silicon oxide and be formed using thermal oxidation or high-density plasma CVD (HDPCVD).

Figure 7:
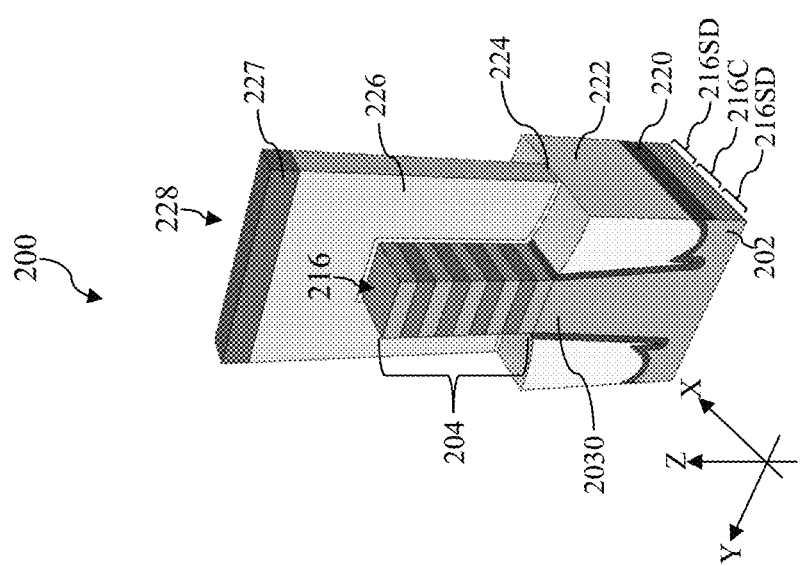

Referring to FIGS. 1 and 7, method 100 includes a block 112 where a dummy gate stack 228 is formed over a channel region 216C of the active region 216. In some embodiments, a gate replacement process (or gate-last process) is adopted where the dummy gate stack 228 serves as a placeholder to undergo various processes and is to be removed and replaced by the functional gate structure. Other processes and configuration are possible. In some embodiments, the dummy gate stack 228 is formed over the substrate 202 and is at least partially disposed over the active region 216. The portion of the active region 216 underlying the dummy gate stack 228 is the channel region 216C of the active region 216. As shown in FIG. 7, the channel region 216C is disposed between source/drain regions 216SD.

In the illustrated embodiment, block 112 first forms a dummy gate dielectric layer 224 over the active region 216. In some embodiments, the dummy gate dielectric layer 224 may include silicon oxide, silicon nitride, a high-K dielectric material and/or other suitable material. In various examples, the dummy gate dielectric layer 224 may be deposited by a CVD process, a sub-atmospheric CVD (SACVD) process, a flowable CVD process, an ALD process, a PVD process, or other suitable process. By way of example, the dummy gate dielectric layer 224 may be used to prevent damages to the active region 216 by subsequent processes (e.g., formation of the dummy gate electrode). Subsequently, block 112 forms other portions of the dummy gate stack 228, including a dummy gate electrode 226 and a gate top hard mask 227 which may include multiple layers. In some embodiments, the dummy gate stack 228 is formed by various process steps such as layer deposition, patterning, etching, as well as other suitable processing steps. Exemplary layer deposition processes include low-pressure CVD, CVD, plasma-enhanced CVD (PECVD), PVD, ALD, thermal oxidation, e-beam evaporation, or other suitable deposition techniques, or combinations thereof. For example, the patterning process may include a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods. In some embodiments, the dummy gate electrode 226 may include polycrystalline silicon (polysilicon). In some embodiments, the gate top hard mask 227 includes an oxide layer such as a pad oxide layer that may include silicon oxide, as well as a nitride layer such as a pad nitride layer that may include silicon nitride, silicon oxynitride and/or silicon carbide.

Still referring to FIG. 7, in some embodiments, after formation of the dummy gate stack 228, the dummy gate dielectric layer 224 is removed from the source/drain regions 216SD of the active region 216. That is, the dummy gate dielectric layer 224 not covered by the dummy gate electrode 226 is removed. The removal process may include a wet etch, a dry etch, and/or a combination thereof. The etch process is chosen to selectively etch the dummy gate dielectric layer 224 without substantially etching the active region 216, the gate top hard mask 227, and the dummy gate electrode 226.

Figure 8:
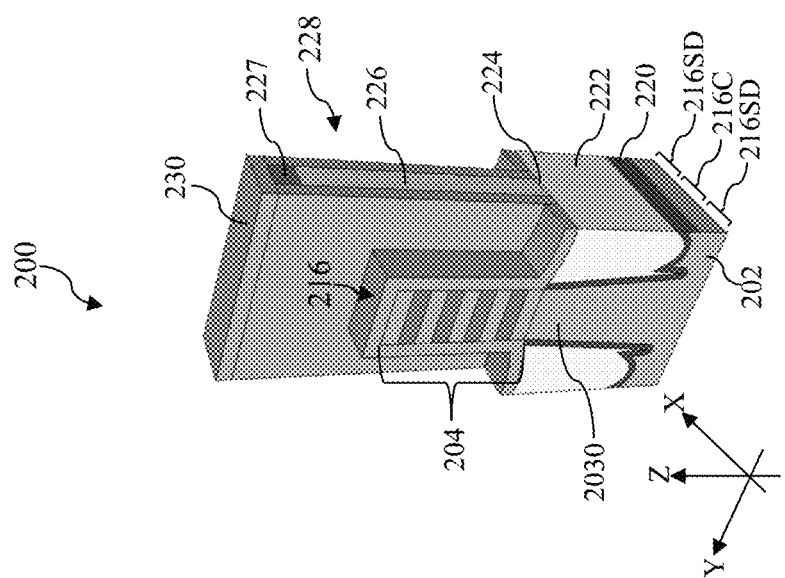

Referring to FIGS. 1 and 8, method 100 includes a block 114 where a gate spacer layer 230 is deposited over the workpiece 200. In some embodiments, spacer material for forming the gate spacer layer 230 is deposited conformally over the workpiece 200, including over top surfaces and sidewalls of the dummy gate stack 228 to form a spacer material layer. The term "conformally" may be used herein for ease of description of a layer having substantially uniform thickness over various regions. The gate spacer layer 230 may have a single-layer construction or include multiple layers. In some embodiments represented in FIG. 8, the gate spacer layer 230 may include silicon carbonitride, silicon oxycarbide, silicon oxycarbonitride, or silicon nitride. The spacer material layer may be deposited over the dummy gate stack 228 using processes such as, CVD process, a subatmospheric CVD (SACVD) process, a flowable CVD process, an ALD process, a PVD process, or other suitable process. While not shown in FIG. 8, the spacer material layer may then be etched back in an anisotropic etch process to expose portions of a top surface of the active region 216 not covered by the dummy gate stack 228. Portions of the spacer material layer directly over the dummy gate stack 228 may be completely removed by this anisotropic etch process while the gate spacer layer 230 remains on sidewalls of the dummy gate stack 228.

Figure 9:
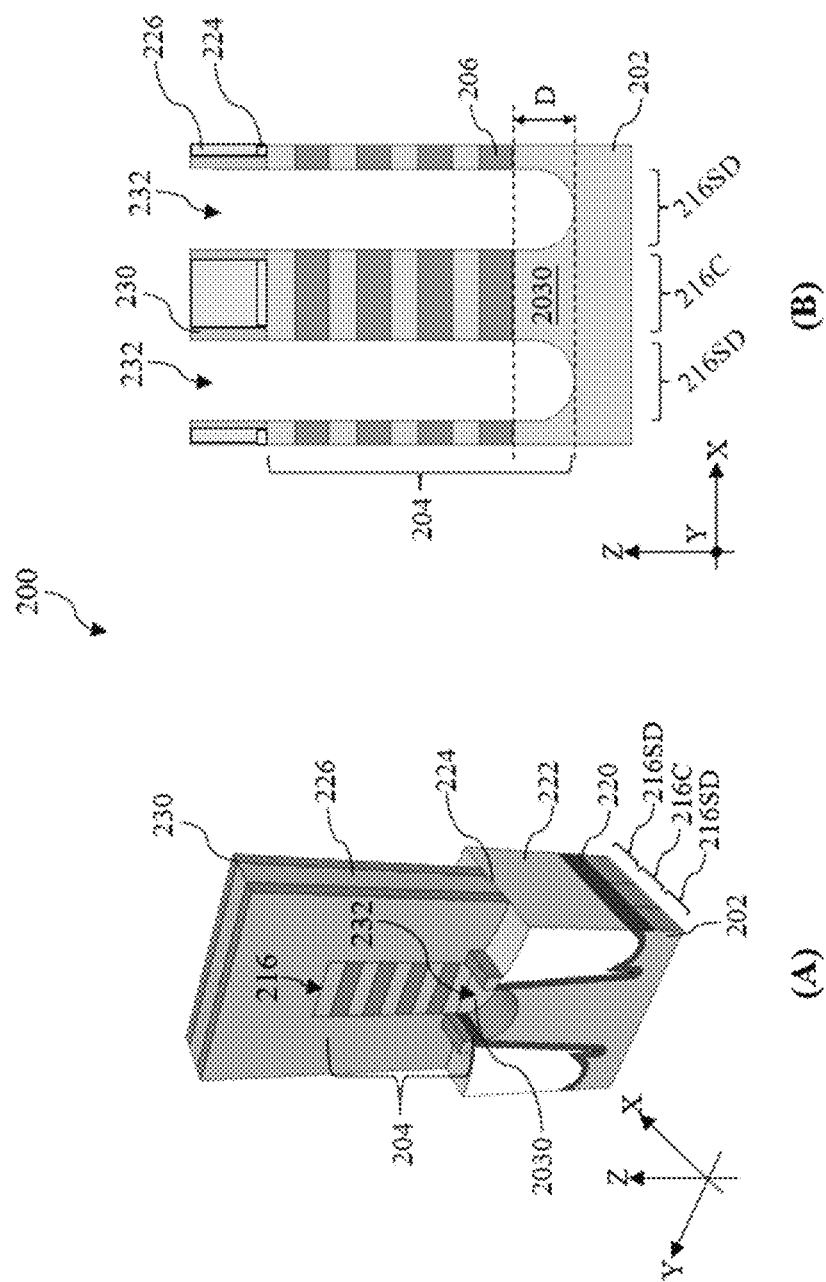

Referring to FIGS. 1 and 9, method 100 includes a block 116 where a source/drain region 216SD of the active region 216 is recessed to form a source/drain recess 232. While not explicitly shown, a photolithography process and at least one hard mask may be used to perform operations at block 116. In some embodiments, the portions of the active region 216 that are not covered by the dummy gate electrode 226 and the gate spacer layer 230 are etched by a dry etch or a suitable etching process to form the source/drain recesses 232. For example, the dry etch process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. In some embodiments represented in FIG. 9, the source/drain regions 216SD of the active region 216 are recessed to expose sidewalls of the sacrificial layers 206 and the channel layers 208. In some implementations, the source/drain recesses 232 extend below the stack 204 into the APT implant region 2030. That is, at least a portion of the APT implant region 2030 is exposed in the source/drain recesses 232. In some instances, each of the source/drain recesses 232 extends below the bottom-most epitaxial layer 206 by a depth D, as shown in FIG. 9B. The depth D may be between about 10 nm and about 20 nm.

Figure 10:
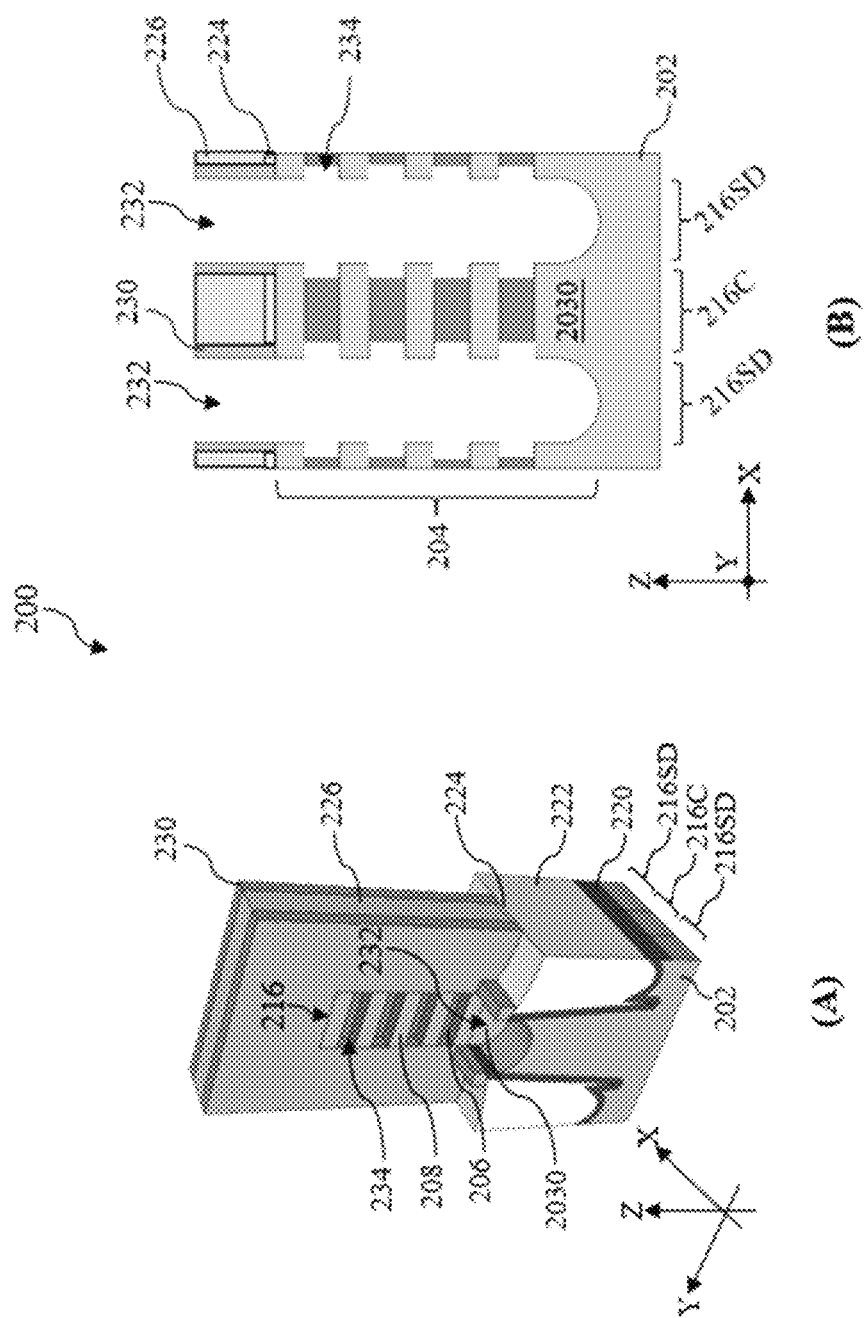

Referring to FIGS. 1 and 10, method 100 includes a block 118 where inner spacer recesses 234 are formed. As shown in FIGS. 10A and 10B, the sacrificial layers 206 exposed in the source/drain recesses 232 are selectively and partially recessed to form inner spacer recesses 234 while the gate spacer layer 230, the APT implant region 2030, and the channel layers 208 are substantially unetched. In an embodiment where the channel layers 208 consist essentially of Si and sacrificial layers 206 consist essentially of SiGe, the selective recess of the sacrificial layers 206 may include a SiGe oxidation process followed by a SiGe oxide removal. In those embodiments, the SiGe oxidation process may include use of ozone. In some embodiments, the selective recess may be a selective isotropic etching process (e.g., a selective dry etching process or a selective wet etching process), and the extent the sacrificial layers 206 are recessed is controlled by duration of the etching process. In some embodiments, the selective dry etching process may include use of one or more fluorine-based etchants, such as fluorine gas or hydrofluorocarbons. As shown in FIGS. 10A and 10B, the inner spacer recesses 234 extend inward from the source/drain recesses 232. In some embodiments, the selective wet etching process may include a hydro fluoride (HF) or NH$_4$OH etchant.

Figure 11:
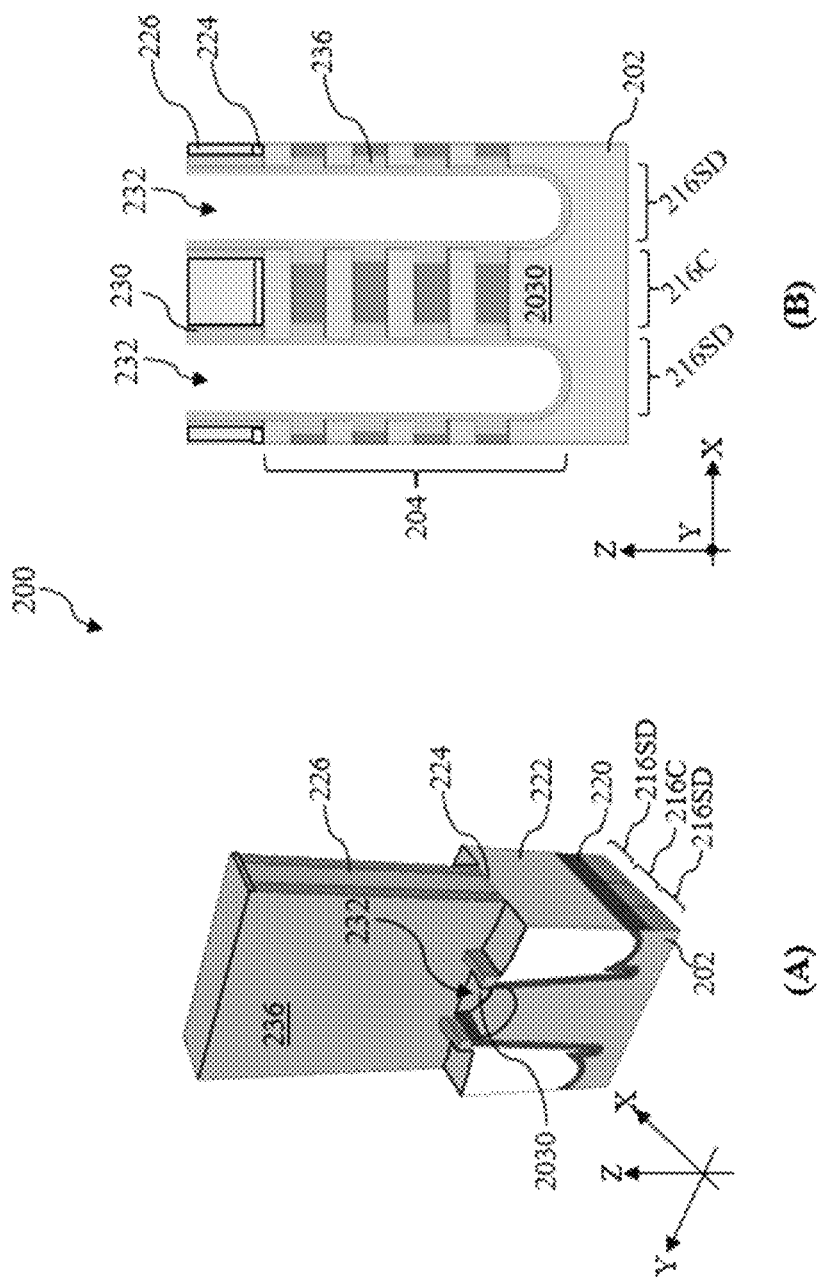
Figure 12:
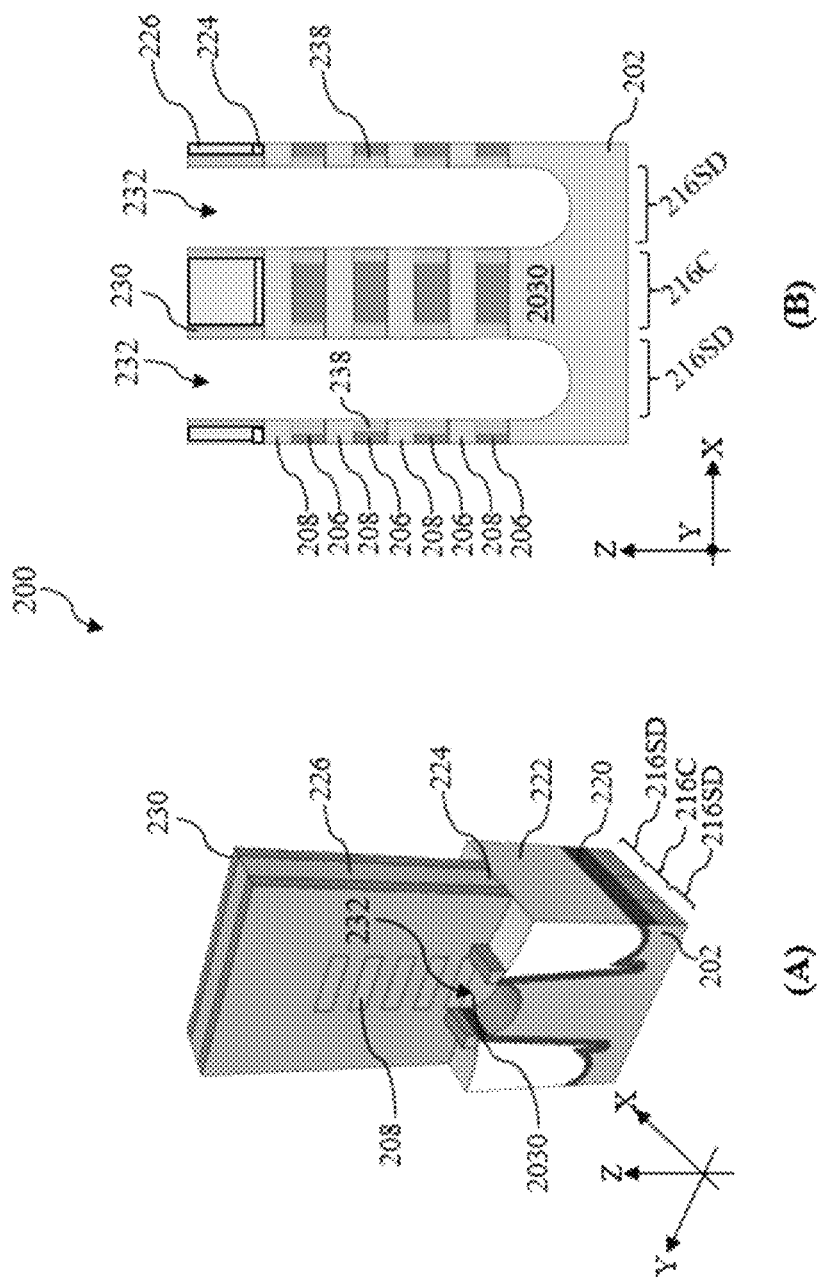

Referring to FIGS. 1, 11 and 12, method 100 includes a block 120 where inner spacer features 238 are formed in the inner spacer recesses 234. In some embodiments, operations at block 120 may include blanket deposition of an inner spacer material layer 236 over the workpiece 200, as shown in FIG. 11, and etch-back of the inner spacer material layer 236, as shown in FIG. 12. The inner spacer material layer 236 illustrated in FIG. 11 may be a single layer or a multilayer. In some implementations, the inner spacer material layer 236 may be deposited using CVD, PECVD, LPCVD, ALD or other suitable method. The inner spacer material layer 236 may include metal oxides, silicon oxide, silicon oxycarbonitride, silicon nitride, silicon oxynitride, carbon-rich silicon carbonitride, or a low-k dielectric material. The metal oxides here may include aluminum oxide, zirconium oxide, tantalum oxide, yttrium oxide, titanium oxide, lanthanum oxide, or other suitable metal oxide. As shown in FIG. 111B, the inner spacer material layer 236 is deposited into the inner spacer recesses 234 and over the sidewalls of the channel layers 208 exposed in the source/drain recesses 232.

Referring to FIG. 12, the inner spacer material layer 236 is then etched back to remove the inner spacer material layer 236 from the sidewalls of the channel layers 208 to obtain the inner spacer features 238 in the inner spacer recesses 234. At block 120, the inner spacer material layer 236 may also be removed from the top surfaces of dummy gate electrode 226, the gate spacer layer 230, and the isolation features 222. In some embodiments, the composition of the inner spacer material layer 236 is selected such that the inner spacer material layer 236 may be selectively removed without substantially etching the gate spacer layer 230. In some implementations, the etch back operations performed at block 120 may include use of hydrogen fluoride (HF), fluorine gas (F$_2$), hydrogen (H$_2$), ammonia (NH$_3$), nitrogen trifluoride (NF$_3$), or other fluorine-based etchants. As shown in FIG. 12, each of the inner spacer features 238 is in direct contact with the recessed sacrificial layers 206 and is disposed between two neighboring channel layers 208.

Figure 13:
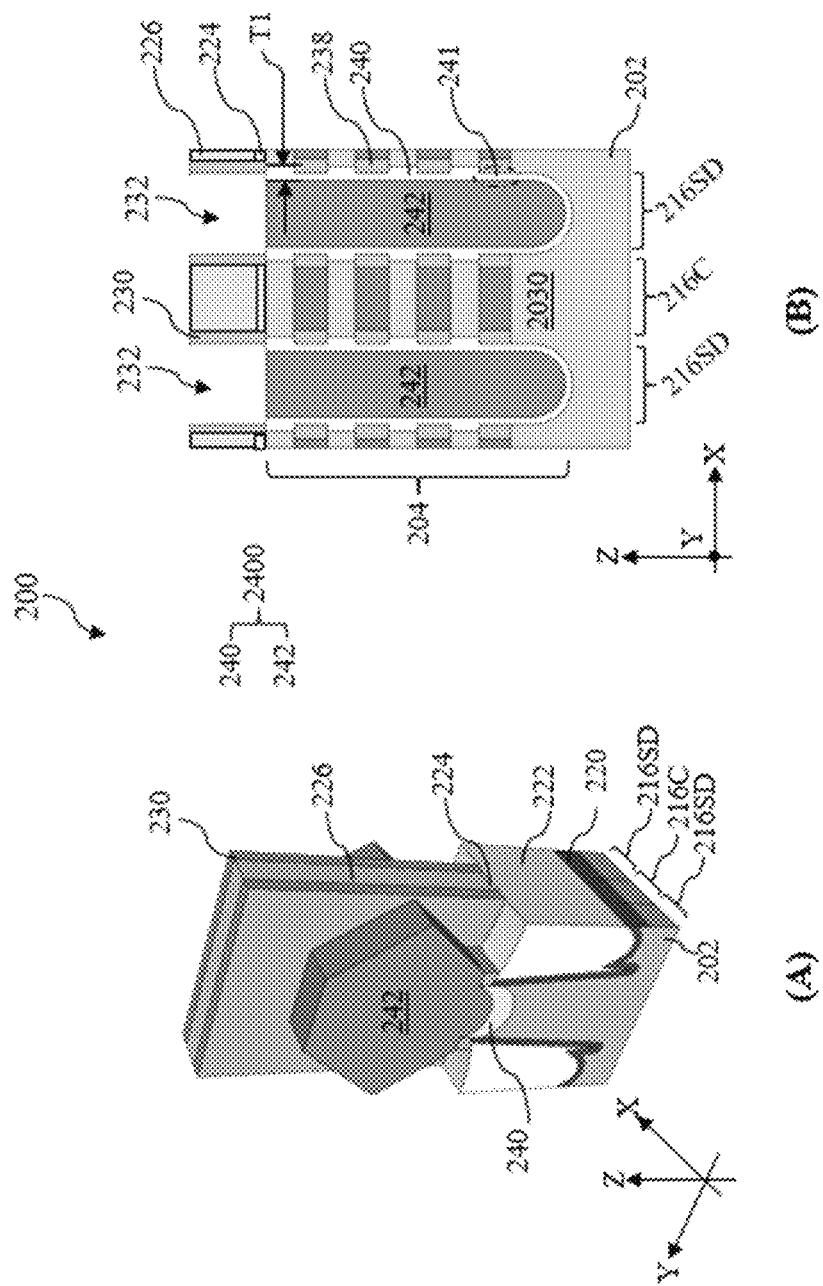
Figure 14:
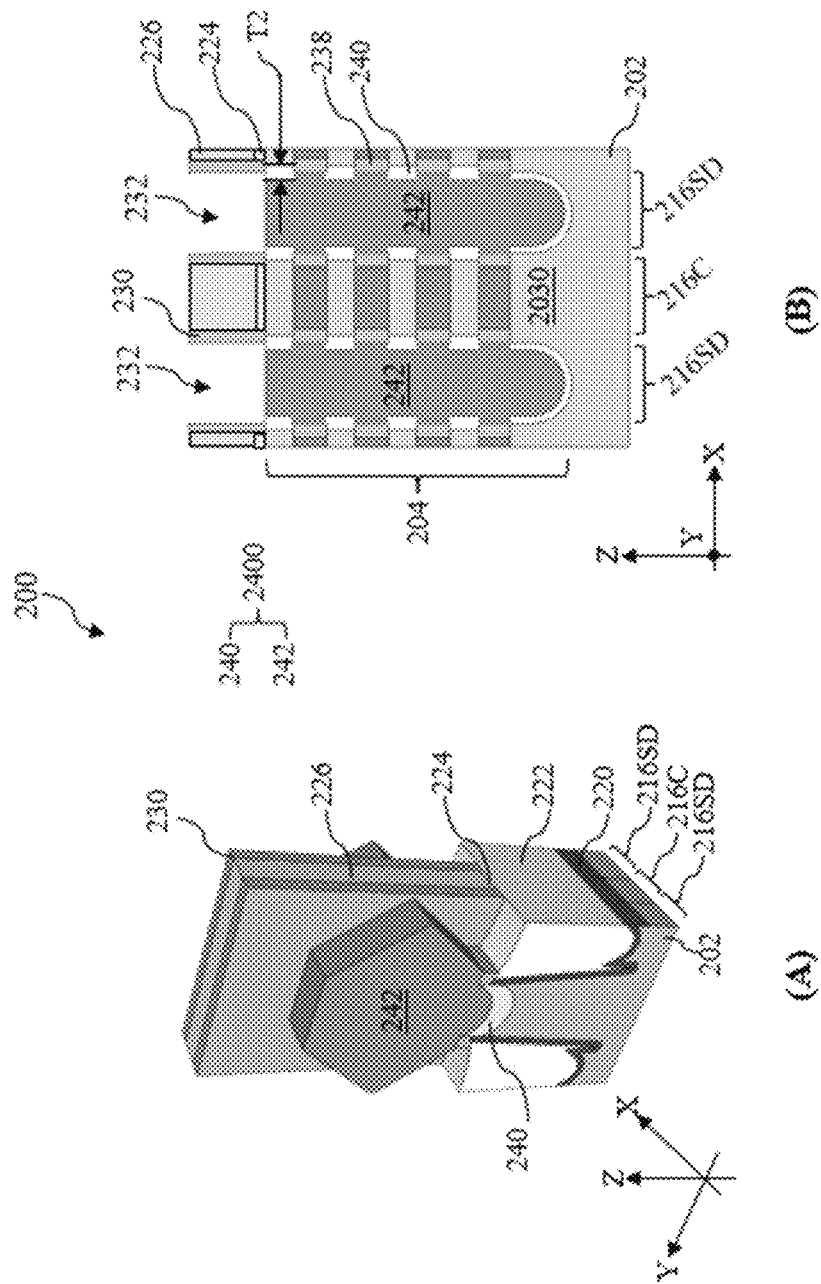

Referring to FIGS. 1, 13 and 14, method 100 includes a block 122 where an outer epitaxial feature 240 is formed in the source/drain recess 232. In some embodiments, the outer epitaxial feature 240 may be epitaxially and selectively formed from the exposed sidewalls of the channel layers 208 and exposed APT implant region 2030. Sidewalls of the sacrificial layers 206 are covered by the outer epitaxial feature 240. Suitable epitaxial processes for block 122 include CVD deposition techniques (e.g., vapor-phase epitaxy (VPE) and/or ultra-high vacuum CVD (UHV-CVD)), molecular beam epitaxy (MBE), and/or other suitable processes. The epitaxial growth process at block 122 may use gaseous and/or liquid precursors, which interact with the composition of the APT implant region 2030 as well as the channel layers 208. In some embodiments, parameters of the epitaxial growth process at block 122 are selected such that the outer epitaxial feature 240 is not epitaxially deposited on the inner spacer features 238. In some embodiments, the outer epitaxial feature 240 includes silicon doped with a first n-type dopant other than phosphorus (P). In one embodiment, the first n-type dopant is arsenide (As) and the outer epitaxial feature 240 includes silicon and arsenide. In some embodiments represented in FIG. 13, the outer epitaxial feature 240 is allowed to coalesce to merge over the inner spacer features 238 (indicated by area 241 in FIG. 13) such that the outer epitaxial feature 240 is contiguous from one channel layer 208 to another channel layer 208. In some alternative embodiments represented in FIG. 14, the outer epitaxial features 240 grown from the exposed channel layers 208 do not coalesce to merge over the inner spacer features 238. In both embodiments shown in FIGS. 13 and 14, the outer epitaxial features 240 is epitaxially formed from the APT implant region 2030 exposed in the source/drain recesses 232.

Referring to FIGS. 1, 13 and 14, method 100 includes a block 124 where an inner epitaxial feature 242 is formed over the outer epitaxial feature 240. In some embodiments, the inner epitaxial feature 242 may be epitaxially and selectively formed from the outer epitaxial feature 240. Suitable epitaxial processes for block 122 include CVD deposition techniques (e.g., vapor-phase epitaxy (VPE) and/or ultra-high vacuum CVD (UHV-CVD)), molecular beam epitaxy (MBE), and/or other suitable processes. The epitaxial growth process at block 124 may use gaseous and/or liquid precursors, which interact with the composition of the outer epitaxial feature 240. In some embodiments, parameters of the epitaxial growth process at block 124 are selected such that the inner epitaxial feature 242 is not epitaxially deposited on the inner spacer features 238 (if exposed, as shown in FIG. 14). In some embodiments, the inner epitaxial feature 242 includes silicon doped with a second n-type dopant different from the first n-type dopant. In one embodiment, the second n-type dopant is phosphorus (P) and the inner epitaxial feature 242 includes silicon and phosphorus. In some embodiments represented in FIG. 13, the inner epitaxial feature 242 is separated or spaced apart from the channel layers 208, the inner spacer features 238, and the APT implant regions 2030 by the outer epitaxial feature 240. In some alternative embodiments represented in FIG. 14, the inner epitaxial features 242 is in contact with the inner spacer features 238 but is spaced apart from the channel layers 208 by the outer epitaxial feature 240. In both embodiments shown in FIGS. 13 and 14, the inner epitaxial features 242 is separated or spaced apart from the APT implant region 2030 by the outer epitaxial feature 240. The outer epitaxial feature 240 and the inner epitaxial feature 242 may be regarded collectively as a source/drain feature 2400 that is disposed over the source/drain regions 216SD. Alternatively, only the inner epitaxial feature 242 may be regarded as the source/drain feature 2400 and the outer epitaxial feature 240 may be regarded as a diffusion retardation layer for the source/drain feature 2400.

Depending on whether it is allowed to merge over the inner spacer features 238, the outer epitaxial feature 240 has different thicknesses. In the embodiments represented in FIG. 13, the outer epitaxial feature 240 has a first thickness T1 measured from a sidewall of a channel layer 208 when it is allowed to merge over the inner spacer features 238. In the embodiments represented in FIG. 14, the outer epitaxial feature 240 has a second thickness T2 measured from a sidewall of a channel layer 208 when it does not merge over the inner spacer features 238. The first thickness T1 is greater than the second thickness T2. In some instances, the first thickness T1 may be between about 4 nm and about 12 nm where the outer epitaxial feature 240 merges over the inner spacer features 238 and the second thickness T2 may be between about 2 nm and about 8 nm where the outer epitaxial feature 240 does merge over the inner spacer features 238. When embodiments in both FIG. 13 and FIG. 14 are considered, the outer epitaxial feature 240 has a thickness between about 2 nm and about 12 nm, as measured from a sidewall of a channel layer 208. In those embodiments illustrated in FIG. 3, the portion of the outer epitaxial feature 240 that is disposed over the inner spacer feature 238 in area 241 has a thickness between about 2 nm and about 4 nm.

According to aspects of the present disclosure, the outer epitaxial feature 240 serves as a diffusion retardation layer that prevents or block diffusion of dopants from the inner epitaxial feature 242 into the outer epitaxial feature 240. In silicon lattices, arsenide (As) has a diffusivity lower than that of phosphorus (P) and phosphorus (P) diffuses at a slower rate in arsenide-doped silicon than in undoped silicon. Therefore, in embodiments where the outer epitaxial feature 240 is doped with arsenide (As) and the inner epitaxial feature 242 is doped with phosphorus (P), the outer epitaxial feature 240 retards diffusion of phosphorus (P) from the inner epitaxial feature 242 into the outer epitaxial features 240 and results in a reduced n-type dopant concentration in the channel layers 208 and the APT implant region 2030. The reduced n-type dopant concentration in the channel layers 208 and the APT implant region 2030 translates into smaller leakage and improved yield. When the outer epitaxial feature 240 has the first thickness T1 and is allowed to merge over the inner spacer features 238, the outer epitaxial feature 240 may retard diffusion along the interface between the inner spacer features 238 and the outer epitaxial feature 240 but the thicker outer epitaxial feature 240 may reduce the volume of the inner epitaxial feature 242. When the outer epitaxial feature 240 has the smaller second thickness T2 and does not merge over the inner spacer features 238, the thinner outer epitaxial feature 240 does not reduce the volume of the inner epitaxial feature 242.

Figure 15:
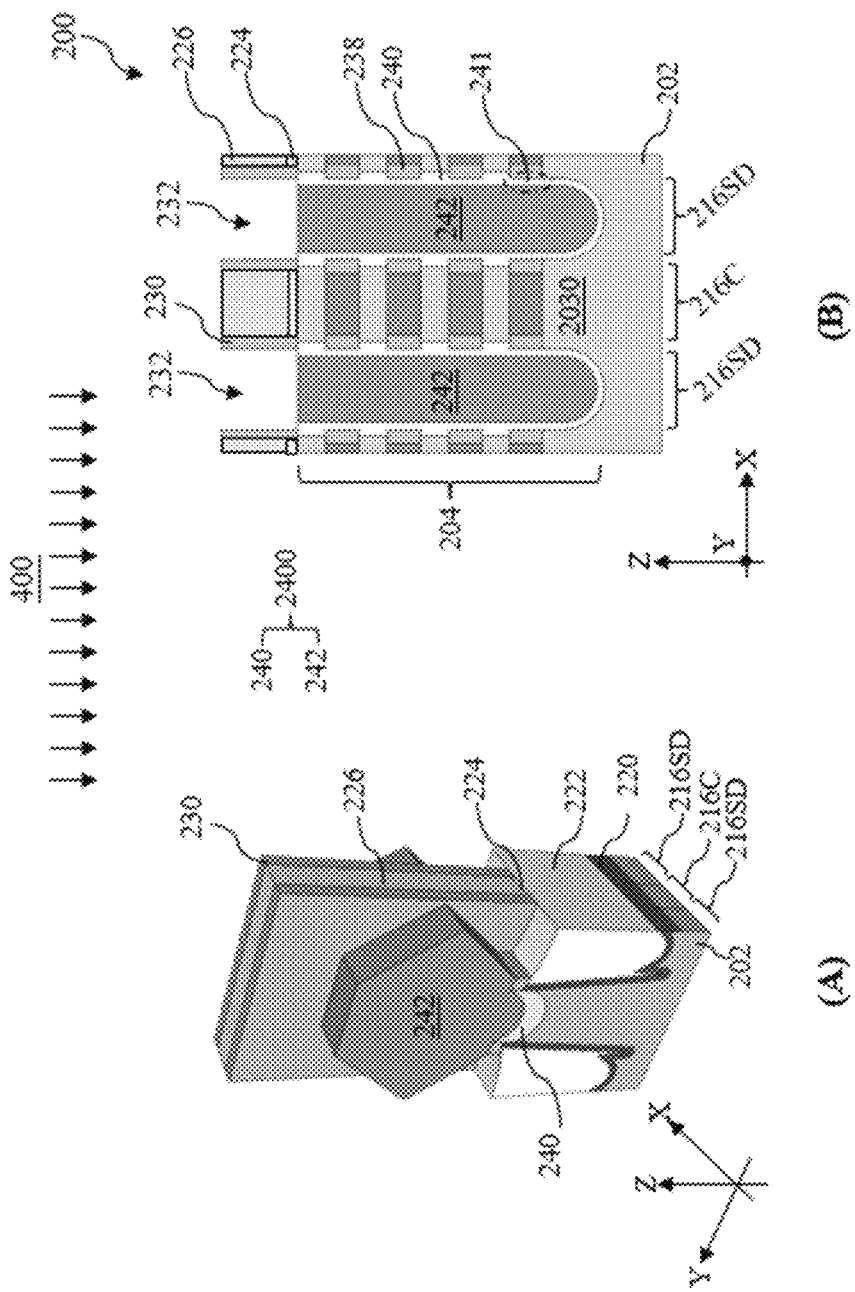
Figure 16:
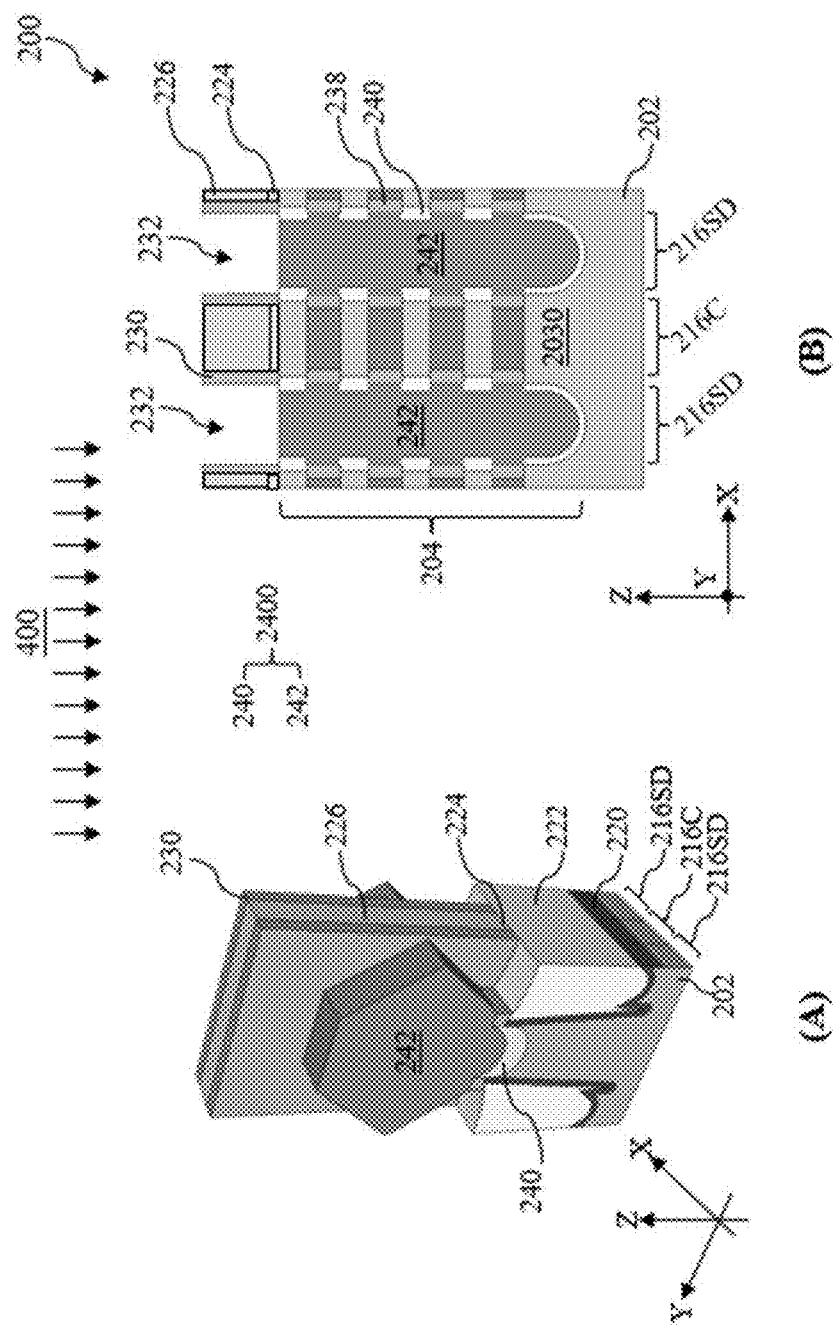

Referring to FIGS. 1, 15 and 16, method 100 includes a block 126 where the outer epitaxial feature 240 and inner epitaxial feature 242 are annealed in an anneal process 400. To activate the dopants in the outer epitaxial feature 240 and the inner epitaxial feature 242, the workpiece 200 may be subject to an anneal process 400. In some implementation, the anneal process 400 may include a rapid thermal anneal (RTA) process, a laser spike anneal process, a flash anneal process, or a furnace anneal process. In some instances, the anneal process 400 includes a peak anneal temperature between about 900° C. and about 1000° C. In these implementations, the peak anneal temperature may be maintained for a duration measured by seconds or microseconds. Through the anneal process 400, a desired electronic contribution from the dopants in the semiconductor host, such as silicon, may be obtained. The anneal process may generate vacancies that facilitate movement of dopants from interstitial sites to substitutional lattice sites and reduce damages or defects in the semiconductor lattice.

Figure 17:
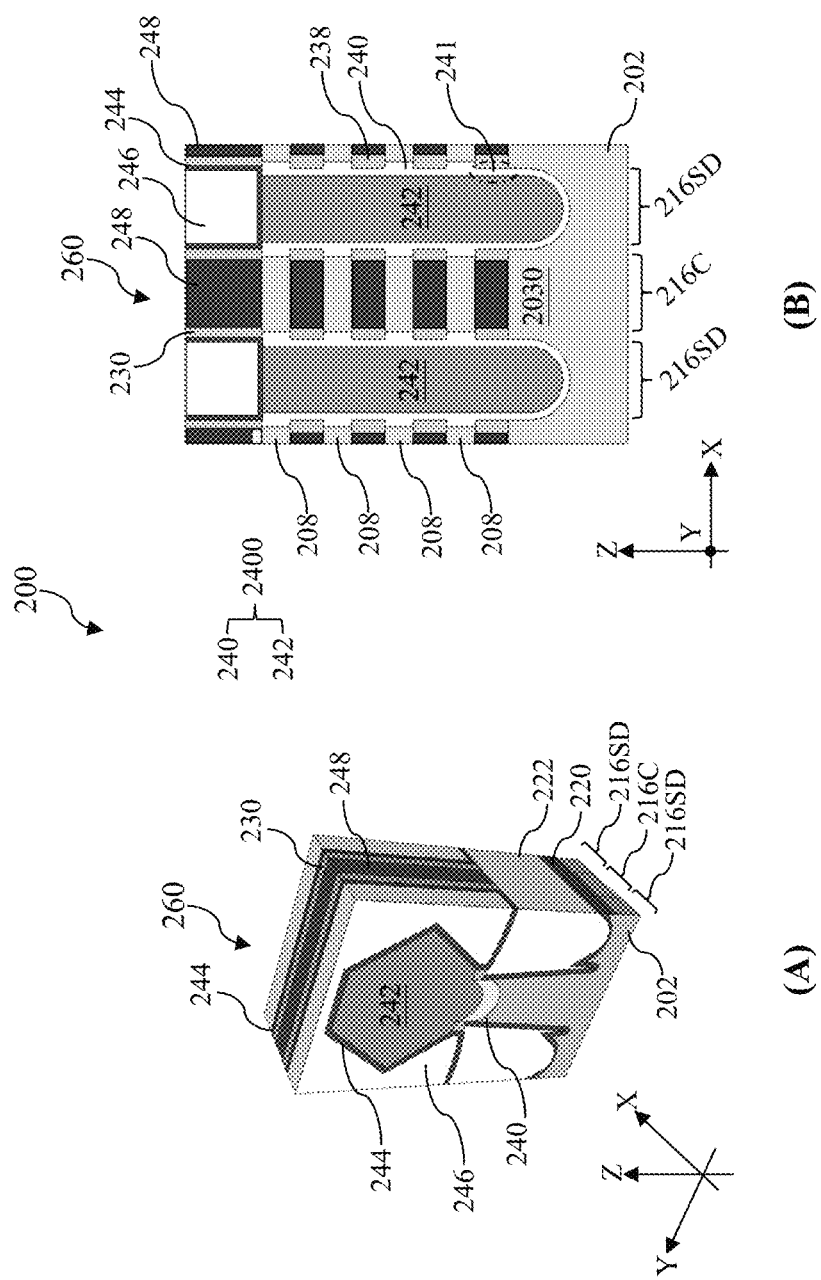
Figure 18:
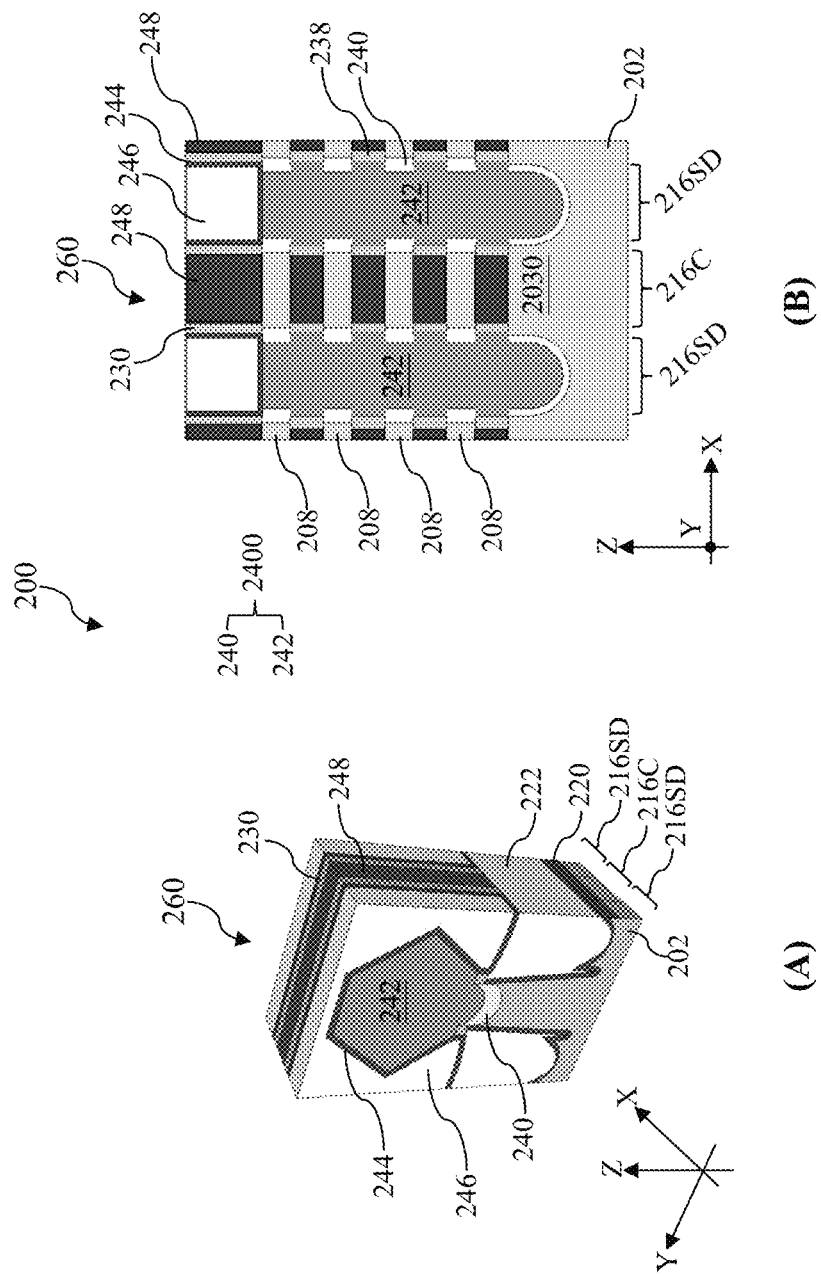

Referring to FIGS. 1, 17, 18, and 19, method 100 includes a block 128 where further processes are performed. Such further processes may include, for example, deposition of a first etch stop layer (ESL) 244 (or a first contact etch stop layer (CESL) 244) over the workpiece 200, deposition of a first dielectric layer 246 (or a first interlayer dielectric (ILD) layer 246) over the first ESL 244, removal of the dummy gate electrode 226 and the dummy gate dielectric layer 224, removal of the sacrificial layers 206 in the channel region 216C to release the channel layers 208 as channel members, formation of a gate structure 248 over the channel region 216C, deposition of a second ESL 250 (or a second CESL 250), and deposition of the second dielectric layer 252 (or a second ILD layer 252). Referring now to FIGS. 17 and 18, the first ESL 244 is formed prior to forming the first ILD layer 246. In some examples, the first ESL 244 includes a silicon nitride layer, a silicon oxide layer, a silicon oxynitride layer, and/or other materials known in the art. The first ESL 244 may be formed by ALD, plasma-enhanced chemical vapor deposition (PECVD) process and/or other suitable deposition or oxidation processes. The first ILD layer 246 is then deposited over the first ESL 244. In some embodiments, the first ILD layer 246 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The first ILD layer 246 may be deposited by a PECVD process or other suitable deposition technique. In some embodiments, after formation of the first ILD layer 246, the workpiece 200 may be annealed to improve integrity of the first ILD layer 246. As shown in FIGS. 17 and 18, the first ESL 244 is disposed directly on top surfaces of the inner epitaxial feature 242 and the outer epitaxial feature 240.

Referring still to FIGS. 17 and 18, after the deposition of the first ESL 244 and the first ILD layer 246, the workpiece 200 may be planarized by a planarization process to expose the dummy gate electrode 226 (shown in FIGS. 15 and 16). For example, the planarization process may include a chemical mechanical planarization (CMP) process. Exposure of the dummy gate electrode 226 allows the removal of the dummy gate electrode 226 and release of the channel layers 208. In some embodiments, the removal of the dummy gate electrode 226 and the dummy gate dielectric layer 224 results in a gate trench over the channel regions 216C. The gate structure 248 may be subsequently formed in the gate trench, as will be described below. The removal of the dummy gate electrode 226 and the dummy gate dielectric layer 224 may include one or more etching processes that are selective to the material in the dummy gate electrode 226 and the dummy gate dielectric layer 224. For example, the removal of the dummy gate electrode 226 and the dummy gate dielectric layer 224 may be performed using as a selective wet etch, a selective dry etch, or a combination thereof that is selective to the dummy gate electrode 226 and the dummy gate dielectric layer 224. After the removal of the dummy gate electrode 226 and the dummy gate dielectric layer 224, surfaces of the channel layers 208 and the sacrificial layers 206 in the channel region 216C are exposed in the gate trench.

After the removal of the dummy gate electrode 226 and the dummy gate dielectric layer 224, the method 100 may include operations to selectively remove the sacrificial layers 206 between the channel layers 208 in the channel region 216C. The selective removal of the sacrificial layers 206 releases the channel layers 208 to form channel members 208. It is noted that the same reference numeral 208 is used to denote channel members 208 for simplicity. The selective removal of the sacrificial layers 206 may be implemented by selective dry etch, selective wet etch, or other selective etch processes. In some embodiments, the selective wet etching includes an APM etch (e.g., ammonia hydroxide-hydrogen peroxide-water mixture). In some embodiments, the selective removal includes SiGe oxidation followed by a SiGeOx removal. For example, the oxidation may be provided by ozone clean and then SiGeOx removed by an etchant such as $NH_4OH$.

The method 100 may include further operations to form the gate structure 248 to wrap around each of the released channel layers 208. The gate structure 248 may be a high-K metal gate structure. In some embodiments, the gate structure 248 is formed within the gate trench and into the space left behind by the removal of the sacrificial layers 206. In this regard, the gate structure 248 wraps around each of the channel members 208. In various embodiments, the gate structure 248 includes an interfacial layer, a high-K gate dielectric layer formed over the interfacial layer, and/or a gate electrode layer formed over the high-K gate dielectric layer. High-K gate dielectrics, as used and described herein, include dielectric materials having a high dielectric constant, for example, greater than that of thermal silicon oxide (~3.9). The gate electrode layer used within the gate structure 248 may include a metal, metal alloy, or metal silicide. Additionally, the formation of the gate structure 248 may include depositions to form various gate materials, one or more liner layers, and one or more CMP processes to remove excessive gate materials and thereby planarize a top surface of the workpiece 200.

In some embodiments, the interfacial layer of the gate structure 248 may include a dielectric material such as silicon oxide, hafnium silicate, or silicon oxynitride. The interfacial layer may be formed by chemical oxidation, thermal oxidation, atomic layer deposition (ALD), chemical vapor deposition (CVD), and/or other suitable method. The high-K gate dielectric layer of the gate structure 248 may include a high-K dielectric layer such as hafnium oxide. Alternatively, the high-K gate dielectric layer of the gate structure 248 may include other high-K dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. The high-K gate dielectric layer may be formed by ALD, physical vapor deposition (PVD), CVD, oxidation, and/or other suitable methods.

Figure 19:
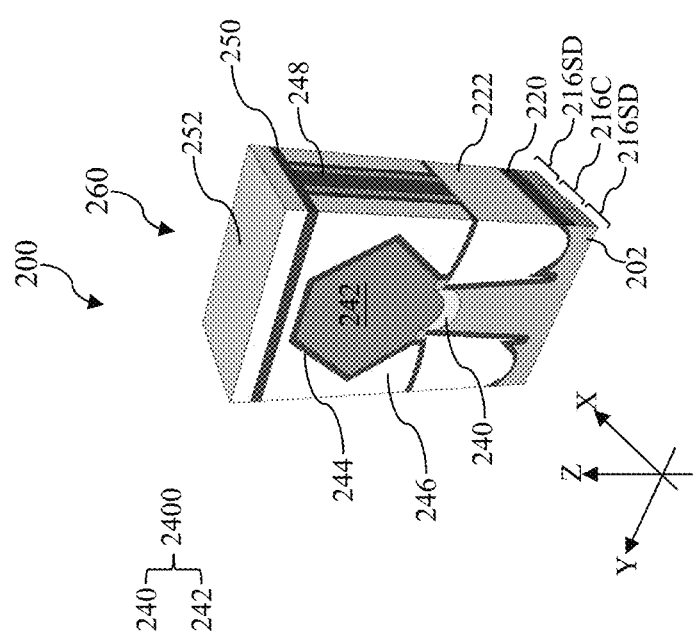

The gate electrode layer of the gate structure 248 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the gate electrode layer of the gate structure 248 may include Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials or a combination thereof. In various embodiments, the gate electrode layer of the gate structure 248 may be formed by ALD, PVD, CVD, e-beam evaporation, or other suitable process. Further, the gate electrode layer may be formed separately for N-FET and P-FET transistors which may use different metal layers (e.g., for providing different n-type and p-type work function metal layers). In various embodiments, a CMP process may be performed to remove excessive metal from the gate electrode layer of the gate structure 248, and thereby provide a substantially planar top surface of the gate structure 248. The gate structure 248 includes portions that interpose between channel members 208 in the channel region 216C. After the CMP process to planarize the gate structure 248, the second ESL 250 is deposited over the planarized surface and the second ILD layer 252 is then deposited over the second ESL 250, as illustrated in FIG. 19. As the compositions and formation processes of the second ESL 250 and the second ILD layer 252 may be similar to those of the first ESL 244 and the first ILD layer 246, detailed descriptions of the second ESL 250 and the second ILD layer 252 are omitted for brevity.

Figure 20:
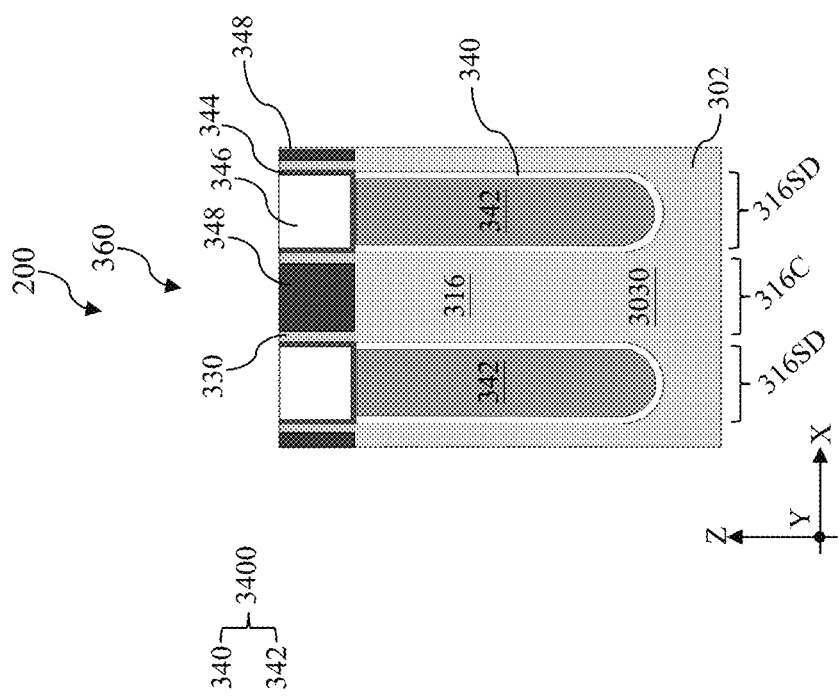
FIG. 20 illustrates an alternative semiconductor device having a diffusion retardation layer, according to one or more aspects of the present disclosure.

An MBC transistor 260 is substantially formed as illustrated in FIGS. 17, 18 and 19 and may be part of the semiconductive device 200. In some embodiments, as the MBC transistor 260 includes a p-type doped APT implant region 2030 and n-type doped inner epitaxial feature 242, the MBC transistor 260 is an n-type MBC transistor. While the method 100 depicts a process for fabricating a MBC transistor, such as the MBC transistor 260, the present disclosure is not so limited. Methods of the present disclosure, including method 100, may be applicable in fabrication of FinFETs. For example, method 100 may be used to fabricate a FinFET 360 representatively shown in FIG. 20. Similar to the MBC transistor 260, the FinFET 360 includes an APT implant region 3030 over a substrate 302, a fin-shaped active region 316, a gate structure 348 over the a channel region 316C of the fin-shaped active region 316, a gate spacer layer 330 lining the gate structure 348, an inner epitaxial feature 342 spaced apart from the fin-shaped active region 316 and the APT implant region 3030 by an outer epitaxial feature 340, a contact etch stop (CEL) layer 344 disposed directly on top surfaces of the inner epitaxial feature 342 and the outer epitaxial feature 340, and an ILD layer 346 over the CEL layer 344. Different from the MBC transistor 260, the fin-shaped active region 316 in the FinFET 360 does not include any stack like the stack 204 and the fin-shaped active region 316 as a whole serves as a fin-shaped channel member. In one embodiment, the outer epitaxial feature 340 includes silicon doped with arsenide (As) to a concentration between about $1\times10^{20}$ atoms/$cm^3$ and about $1\times10^{21}$ atoms/$cm^3$ and the inner epitaxial feature 342 includes silicon doped with phosphorus (P). With a diffusivity smaller than that of phosphorus (P), the foregoing arsenide (As) concentration (i.e., between about $1\times10^{20}$ atoms/$cm^3$ and about $1\times10^{21}$ atoms/$cm^3$) in the outer epitaxial feature 340 has been observed to effectively prevent or block diffusion of phosphorus (P) from the inner epitaxial feature 342 into the outer epitaxial feature 340. Put differently, like the outer epitaxial feature 240 in the MBC transistor 260 in FIG. 19, the outer epitaxial feature 340 with the aforementioned arsenide concentration (i.e., between about $1\times10^{20}$ atoms/$cm^3$ and about $1\times10^{21}$ atoms/$cm^3$) functions as a diffusion retardation layer for dopants in the inner epitaxial feature 342. The outer epitaxial feature 340 and the inner epitaxial feature 342 of the FinFET 360 may be regarded collectively as a source/drain feature 3400 that is disposed over the source/drain regions 316SD. Alternatively, only the inner epitaxial feature 342 may be regarded as the source/drain feature 3400 and the outer epitaxial feature 340 may be regarded as a diffusion retardation layer for the source/drain feature 3400.

Although not intended to be limiting, one or more embodiments of the present disclosure provide many benefits to a semiconductor device and the formation thereof. For example, embodiments of the present disclosure provide an outer epitaxial feature disposed between an APT implant region and a channel member and a doped inner epitaxial feature. The outer epitaxial feature is doped with a first n-type dopant and the inner epitaxial feature is doped with a second n-type dopant different from the first n-type dopant. The first n-type dopant has a diffusivity smaller than that of the second n-type dopant and the outer epitaxial feature functions as a diffusion retardation layer to block diffusion of the second n-type dopants. In one embodiment, the first n-type dopant is arsenide (As) and the second n-type dopant is phosphorus (P). By retarding diffusion of the first n-type dopant, the outer epitaxial feature may reduce leakage through the APT implant region or the channel members.

In one exemplary aspect, the present disclosure is directed to a semiconductor device. The semiconductor device includes an anti-punch-through (APT) region over a substrate, a plurality of channel members over the APT region, a gate structure wrapping around each of the plurality of channel members, a source/drain feature adjacent to the gate structure, and a diffusion retardation layer. The source/drain feature is spaced apart from the APT region by the diffusion retardation layer. The source/drain feature is spaced apart from each of the plurality of channel members by the diffusion retardation layer and the diffusion retardation layer includes a semiconductor material.

In some embodiments, the source/drain feature includes a first n-type dopant, the APT region includes a p-type dopant, and the diffusion retardation layer includes a second n-type dopant different from the first n-type dopant. In some embodiments, the source/drain feature includes phosphorus (P), the APT region includes boron (B), and the diffusion retardation layer includes arsenide (As). In some implementations, the diffusion retardation layer includes silicon and arsenide and a concentration of arsenide in the diffusion retardation layer is between about $1 \times 10^{20}$ atoms/cm$^3$ and about $1 \times 10^{21}$ atoms/cm$^3$. In some instances, a concentration of boron in the APT region is between about $1 \times 10^{18}$ atoms/cm$^3$ and about $1 \times 10^{19}$ atoms/cm$^3$. In some embodiments, the semiconductor device further includes a plurality of inner spacer features. The plurality of channel members are partially spaced apart from one another by the plurality of inner spacer features, and the diffusion retardation layer extends over the plurality of inner spacer features and is disposed between the source/drain feature and the plurality of inner spacer features. In some embodiments, the diffusion retardation layer includes a thickness between about 2 nm and about 12 nm.

In another exemplary aspect, the present disclosure is directed to a semiconductor device. The semiconductor device includes an anti-punch-through (APT) region over a substrate, a fin-shaped active region over the APT region, a gate structure over the fin-shaped active region, and a source/drain feature adjacent to the gate structure. The source/drain feature includes an outer epitaxial feature in contact with the fin-shaped active region, and an inner epitaxial feature over the outer epitaxial feature. The outer epitaxial feature is disposed between the inner epitaxial feature and the fin-shaped active region, and the outer epitaxial feature includes a first n-type dopant and the inner epitaxial feature includes a second n-type dopant different from the first n-type dopant.

In some embodiments, the outer epitaxial feature is in contact with the APT region, and the outer epitaxial feature is disposed between the inner epitaxial feature and the APT region. In some implementations, the first n-type dopant is arsenide (As), the second n-type dopant is phosphorus (P), and the APT region includes boron (B). In some implementations, the outer epitaxial feature further includes silicon (Si), and a concentration of arsenide (As) in the outer epitaxial feature is between about $1 \times 10^{20}$ atoms/cm$^3$ and about $1 \times 10^{21}$ atoms/cm$^3$. In some embodiments, the semiconductor device further includes an etch stop layer over the source/drain feature and in direct contact with the inner epitaxial feature and the outer epitaxial feature.

In yet another exemplary aspect, the present disclosure is directed to a method. The method includes implanting a substrate with a dopant to form an anti-punch-through (APT) implant layer in the substrate, forming at least one semiconductor layer over the APT implant layer, forming a fin-shaped active region from the at least one semiconductor layer over the APT implant layer, the fin-shaped active region including a channel region and a source/drain region adjacent the channel region, forming a dummy gate stack over the channel region of the fin-shaped active region, depositing a gate spacer layer over the dummy gate stack and the source/drain region of the fin-shaped active region, recessing the source/drain region to form a source/drain recess, forming a first epitaxial layer in the source/drain recess where the first epitaxial layer includes a first n-type dopant, and forming a second epitaxial layer over the first epitaxial layer. The second epitaxial layer includes a second n-type dopant different from the first n-type dopant.

In some embodiments, the first n-type dopant is arsenide (As), and the second n-type dopant is phosphorus (P). In some implementations, a concentration of the first n-type dopant in the first epitaxial layer is between about $1 \times 10^{20}$ atoms/cm$^3$ and about $1 \times 10^{21}$ atoms/cm$^3$. In some implementations, the method further includes after the forming of the second epitaxial layer, annealing the first epitaxial layer and the second epitaxial layer at a temperature between about 800° C. and about 1000° C. In some implementations, the forming of the fin-shaped active region includes etching into the APT implant layer to form an APT implant region having an exposed sidewall, and wherein the forming of the first epitaxial layer includes epitaxially growing the first epitaxial layer from the exposed sidewall of the APT region. In some instances, the at least one semiconductor layer includes a plurality of silicon layers interleaved by a plurality of silicon germanium layers. In some embodiments, the method may further include before the forming of the first epitaxial layer, partially recessing the plurality of silicon germanium layers exposed in the source/drain recess to form a plurality of inner spacer recesses, depositing an inner spacer material layer over the source/drain recess and into the plurality of inner spacer recesses, and etching back the deposited inner spacer material layer to expose the plurality of silicon layers in the source/drain recess, so as to form a plurality of inner spacer features in the plurality of inner spacer recesses. The forming the first epitaxial layer in the source/drain recess includes selectively and epitaxially growing the first epitaxial layer from the exposed plurality of silicon layers. In some instances, the selectively and epitaxially growing of the first epitaxial layer from the exposed plurality of silicon layers includes epitaxially growing the first epitaxial layer until the first epitaxial layer covers the plurality of inner spacer features.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor structure, comprising:
a substrate;
a plurality of nanostructures over the substrate;
a gate structure wrapping around each of the plurality of nanostructures;
a plurality of inner spacer features interleaving the plurality of nanostructures;
a source/drain feature adjacent the gate structure;

a diffusion retardation layer disposed between each of the plurality of nanostructures and the source/drain feature; and
a contact etch stop layer disposed on and in contact with the source/drain feature and the diffusion retardation layer,
wherein the source/drain feature is in direct contact with the plurality of inner spacer features,
wherein the diffusion retardation layer comprises a first n-type dopant and the source/drain features comprises a second n-type dopant different from the first n-type dopant.

2. The semiconductor structure of claim 1,
wherein the substrate comprises an anti-punch-through (APT) region,
wherein the plurality of nanostructures are disposed over the APT region.

3. The semiconductor structure of claim 2, wherein the APT region comprises a p-type dopant.

4. The semiconductor structure of claim 3, wherein the p-type dopant is boron (B).

5. The semiconductor structure of claim 4, wherein a concentration of boron in the APT region is between about $1\times10^{18}$ atoms/cm$^3$ and about $1\times10^{19}$ atoms/cm$^3$.

6. The semiconductor structure of claim 1,
wherein the first n-type dopant is arsenic (As),
wherein the second n-type dopant is phosphorus (P).

7. The semiconductor structure of claim 6,
wherein the diffusion retardation layer comprises silicon, and
wherein a concentration of first n-type dopant in the diffusion retardation layer is between about $1\times10^{20}$ atoms/cm$^3$ and about $1\times10^{21}$ atoms/cm$^3$.

8. The semiconductor structure of claim 1, wherein the diffusion retardation layer comprises a thickness between about 2 nm and about 12 nm measured from sidewalls of the plurality of nanostructures.

9. A semiconductor structure, comprising:
a first source/drain feature and a second source/drain feature over a substrate;
a plurality of nanostructures disposed over the substrate and extending between the first source/drain feature and the second source/drain feature along a direction;
a plurality of diffusion retardation features, wherein each of the plurality of nanostructures is spaced apart from the first source/drain feature or the second source/drain feature by one of the plurality of diffusion retardation features; and
a contact etch stop layer (CESL) disposed over the first source/drain feature,
wherein the CESL is in direct contact with at least one of the plurality of diffusion retardation features,
wherein the plurality of diffusion retardation features comprise a first n-type dopant,
wherein the first source/drain feature and the second source/drain feature comprise a second n-type dopant different from the first n-type dopant.

10. The semiconductor structure of claim 9,
wherein the first source/drain feature and the second source/drain feature is spaced apart from the substrate by a first diffusion retardation layer and a second diffusion retardation layer,
wherein the first diffusion retardation layer and the second diffusion retardation layer comprise the first n-type dopant.

11. The semiconductor structure of claim 10,
wherein the first n-type dopant is arsenide (As),
wherein the second n-type dopant is phosphorus (P).

12. The semiconductor structure of claim 10,
wherein the substrate comprises an anti-punch-through (APT) region,
wherein the APT region comprises a p-type dopant,
wherein the plurality of nanostructures are disposed over the APT region.

13. The semiconductor structure of claim 12, wherein the p-type dopant is boron (B).

14. The semiconductor structure of claim 12, wherein a portion of the APT region is sandwiched between the first diffusion retardation layer and the second diffusion retardation layer.

15. The semiconductor structure of claim 9, further comprising:
a gate structure wrapping around each of the plurality of nanostructures.

16. The semiconductor structure of claim 15, further comprising:
a plurality of inner spacer features interleaving the plurality of nanostructures and in contact with the gate structure.

17. The semiconductor structure of claim 16, wherein the plurality of inner spacer features are in contact with the first source/drain feature.

18. A semiconductor structure, comprising:
a first source/drain feature and a second source/drain feature over a substrate;
a plurality of nanostructures disposed over the substrate and extending between the first source/drain feature and the second source/drain feature along a direction;
a plurality of diffusion retardation features, wherein each of the plurality of nanostructures is spaced apart from the first source/drain feature or the second source/drain feature by one of the plurality of diffusion retardation features;
a first diffusion retardation layer between the first source/drain feature and the substrate;
a second diffusion retardation layer between the second source/drain feature and the substrate; and
a contact etch stop layer (CESL) disposed directly on top surfaces of the first source/drain feature, the second source/drain feature, and at least one of the plurality of diffusion retardation features,
wherein the plurality of diffusion retardation features, the first diffusion retardation layer and the second diffusion retardation layer comprise a first n-type dopant,
wherein the first source/drain feature and the second source/drain feature comprise a second n-type dopant different from the first n-type dopant.

19. The semiconductor structure of claim 18,
wherein the substrate comprises an anti-punch-through (APT) region,
wherein the APT region comprises a p-type dopant,
wherein the plurality of nanostructures are disposed over the APT region.

20. The semiconductor structure of claim 19, wherein a portion of the APT region is sandwiched between the first diffusion retardation layer and the second diffusion retardation layer.

* * * * *